US006185139B1

(12) United States Patent
Pantelakis et al.

(10) Patent No.: US 6,185,139 B1
(45) Date of Patent: Feb. 6, 2001

(54) CIRCUIT AND METHOD FOR ENABLING SEMICONDUCTOR DEVICE BURN-IN

(75) Inventors: Dimitris C. Pantelakis; William L. Martino, Jr., both of Austin; Eric S. Powers, Round Rock, all of TX (US)

(73) Assignee: Motorola, Inc., Schaumburg, IL (US)

( * ) Notice: Under 35 U.S.C. 154(b), the term of this patent shall be extended for 0 days.

(21) Appl. No.: 09/481,864

(22) Filed: Jan. 12, 2000

(51) Int. Cl.[7] .................................................. G11C 29/00
(52) U.S. Cl. .......................................... 365/201; 365/226
(58) Field of Search ................................... 365/201, 226, 365/189.09, 189.07, 189.02, 185.09

(56) References Cited

U.S. PATENT DOCUMENTS

| 5,349,559 | * | 9/1994 | Park et al. ........................... 365/201 |
| 5,452,253 | * | 9/1995 | Choi .................................... 365/201 |
| 5,497,348 | * | 3/1996 | Tsay .................................... 365/201 |
| 5,557,232 | * | 9/1996 | Shimogawa ........................... 365/226 |
| 5,946,242 | * | 8/1999 | Cho et al. ............................. 365/226 |
| 6,038,189 | * | 3/2000 | Morishita ............................. 365/226 |

OTHER PUBLICATIONS

Chao et al., "A New On–chip Voltage Regulator for High Density CMOS DRAMs," IEEE, pp. 108–109 (1992).

* cited by examiner

*Primary Examiner*—Tan T. Nguyen
(74) *Attorney, Agent, or Firm*—James L. Clingan, Jr.

(57) ABSTRACT

An integrated circuit device includes low voltage internal circuitry and a first external pin which receives a first information signal. The first information signal provides operating information within a predetermined voltage range. The device includes a mode detector coupled to the first external pin. The mode detector provides a mode enable signal in response to the first information signal being at a voltage that is outside the predetermined voltage range. The device further includes a switchable regulator which provides a supply voltage to the low voltage internal circuitry to power the low voltage internal circuitry at a regulated voltage in a normal mode of the integrated circuit memory and at a higher voltage than the regulated voltage in response to the mode enable signal.

5 Claims, 3 Drawing Sheets

CIRCUIT AND METHOD FOR ENABLING SEMICONDUCTOR DEVICE BURN-IN

FIELD OF THE INVENTION

The present invention is related to integrated circuits and more particularly to a circuit and method for enabling burn-in operation on integrated circuits with an internally generated voltage supply.

BACKGROUND OF THE INVENTION

Integrated circuit devices are universally prevalent in a wide variety of electronic applications. Integrated circuit manufacturers must guarantee the reliability of integrated circuit devices to meet customer demands. Reliability data is typically acquired by operating the integrated circuit devices for an extended duration to determine the lifetime of the devices. To accelerate this reliability testing process, manufacturers typically employ burn-in procedures to decrease the total time necessary to detect failures. Typically, burn-in has been achieved by simply elevating the operating voltages applied to the device. Increased operating voltages increase the stress to which the devices were subjected and accelerate any failure mechanisms to which the devices were susceptible.

Prior to the advent of deep sub-micron devices, integrated circuits typically operated on a single operating voltage supply ($V_{dd}$). More recently, however, the operating voltage that is applied externally to an integrated circuit device is not the operating voltage that is applied to the internal circuits of the integrated circuit. More specifically, in an increasingly common arrangement, the externally supplied operating voltage is translated to a lower voltage that supplies the internal circuitry of the device. This lower internal operating voltage is necessary in view of the extremely thin oxides characteristic of deep sub-micron devices. To accomplish this translation of operating voltages, such devices typically require a voltage regulator circuit that produces the lower internal operating voltage. Unfortunately, the inclusion of a regulator circuit has an effect on the manner in which burn-in is accomplished. In devices that include a regulator circuit, it is not sufficient to simply raise the externally supplied operating voltage because the regulator circuit will continue to produce a substantially equivalent internal operating voltage. Moreover, it is desirable to achieve an exact burn-in voltage, i.e., the voltage applied to a pin is passed onto the internal circuit. To address this issue, integrated circuit manufacturers have incorporated additional pins into the device to provide a mechanism by which the internal operating voltage can be externally manipulated. It will be readily appreciated, however, that the addition of external pins to the integrated circuit not only increases cost, but is frequently prohibited by industry standard configurations. In other words, integrated circuit manufacturers frequently do not have the freedom to add one or more external pins to a particular device. Therefore, it is highly desirable to implement a solution by which integrated circuit devices that operate on an internal voltage that is less then the externally supplied operating voltage can be subjected to an adequate burn-in test without increasing the device pin count. The solution should be insensitive to process voltage and temperature. Further, it is desirable to enter burn-in operation in a controlled manner.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE FIGURES

The present invention contemplates the ability to achieve burn-in of an integrated circuit device in which the internal operating voltage is not capable of being directly manipulated easily and accurately by altering the externally supplied operating voltage. The inclusion of a burn-in enable detection circuit as described herein enables the integrated circuit device 100 to assume a burn-in state in which the internal operating supply voltage is directly manipulated with an existing device pin. The use of the burn-in enable circuit provides a mechanism by which internal operating circuitry may be suitably controlled in devices where the addition of one or more dedicated external burn-in pins is prohibited.

Figure 1:
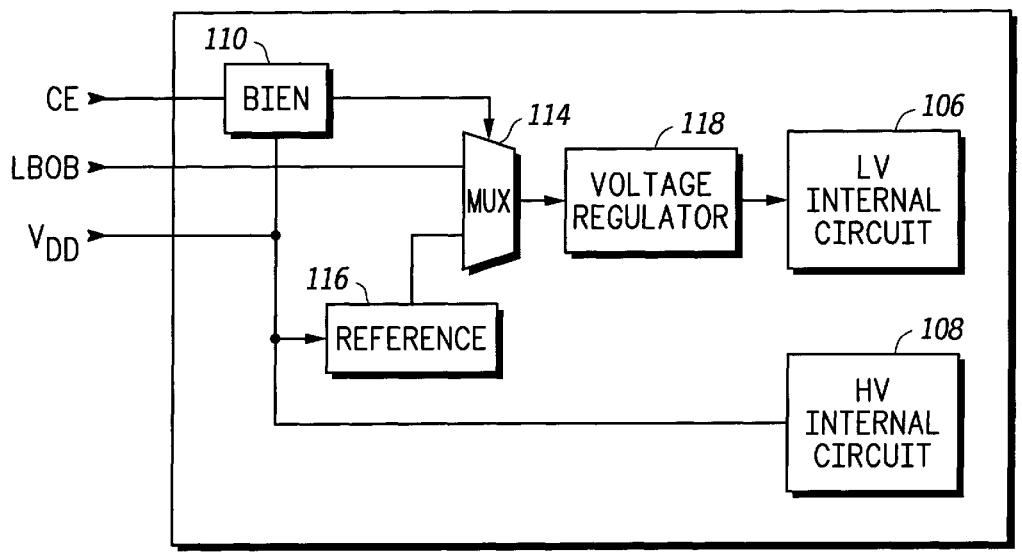
FIG. 1 is a simplified block diagram of an integrated circuit device incorporating a burn-in enable circuit.

Turning now to FIG. 1, a block diagram of portions of an integrated circuit device 100 according to one embodiment of the present invention is depicted. Integrated circuit device 100 may comprise an integrated circuit memory device such as a static RAM. It will be appreciated, however, that the invention is suitable for use in essentially any MOS integrated circuit. Integrated circuit device 100 receives a power supply ($V_{dd}$) on external pin 104. The embodiment of integrated circuit device 100 contemplated herein includes low voltage internal circuitry 106 as well as high voltage internal voltage circuitry 108. As their names suggest, low voltage internal circuitry includes circuits designed to operate at a low voltage relative to the circuitry in high voltage internal circuit 108. The power supply voltage $V_{dd}$ is supplied directly to high-voltage internal circuitry 108. The $V_{dd}$ power supply is also supplied to the input of a reference voltage generator 116. The output of reference voltage generator 116 is provided to a first input of a multiplexer 114. A second input of multiplexer 114 is connected to a second external pin 112 that is utilized to provide a burn-in voltage. In the depicted embodiment, the chip enable pin (CE) is chosen as the second external pin 112. In one embodiment in which the externally supplied power supply voltage $V_{dd\ is}$ in the range of approximately 3.3 volts, a typical output of reference voltage generator 116 is in the range of approximately 1.8 volts. This lower voltage is suitable for operating the deep sub-micron, thin oxide transistors characteristic of low voltage internal circuitry 106. In standard operating mode, the output of reference voltage generator 116 is routed to a voltage regulator 118 (via an intermediate mux 114). The output of regulator 118 is applied to the lower voltage internal circuitry 106.

The incorporation of a reference voltage generator 116 enables the manufacturer to incorporate technology advances into the bulk of the internal circuitry (i.e., the low voltage internal circuitry 106) without disrupting compatibility with existing systems and sockets which may implement a higher voltage. Manufacturers typically want to implement the latest technology to achieve benefits in dye size, speed, and power consumption offered by deep sub-micron technologies. Unfortunately, these deep sub-micron technologies typically utilize extremely thin (i.e., less than 5 nanometers). These extremely thin oxides are susceptible to leakage and breakdown under application of the operating voltages commonly encountered in commercially distributed systems (e.g., 3.3 volts).

Figure 2:
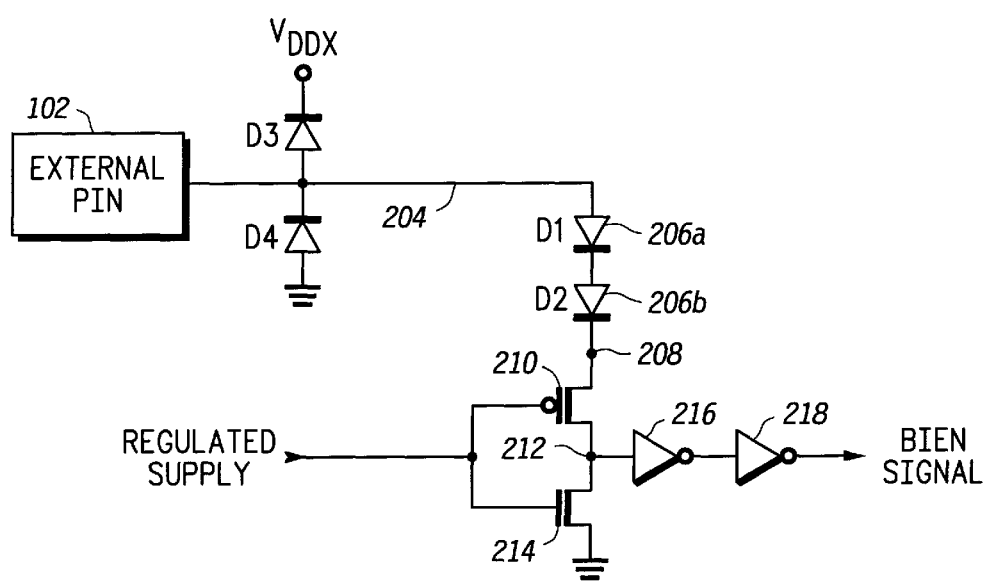
FIG. 2 is a circuit diagram of the burn-in enable circuit of FIG. 1 according to one embodiment of the present invention.

Reference voltage generator 116 is preferably designed to output a substantially constant output voltage in the presence of variation in the supplied input voltage. Thus, reference voltage generator 116 eliminates or significantly impacts the ability to manipulate the voltage supplied to at least a portion of the internal circuitry by simply manipulating the power supply voltage applied to pin 104. Burn-in enable circuit 110 addresses this potential drawback by providing a signal that detects a burn-in condition applied to integrated circuit device 100. More specifically, burn-in enable detector 110 is connected to a first external pin 102. In the depicted embodiment, the linear burst order (LBOB) pin is chosen as first external pin 102. First external pin 102, in addition to being connected to burn-in enable circuit 110, it is further connected to low voltage internal operating circuitry 106. In normal operating mode, first input pin 102 provides operating information to internal circuitry 106 within a predetermined voltage range (i.e., between ground and the operational $V_{dd}$). In normal operating mode, the voltage applied to first external pin 102 is maintained between ground and the power supply voltage by the presence of input protection circuitry 202 (as shown in FIG. 2) that will be familiar to those knowledgeable in integrated circuit design. By connecting first external pin 102 to burn-in enable detector 110 and low-voltage internal circuitry 106, the invention is able to utilize a single existing pin to achieve the ability to discriminate between normal operating mode and burn-in mode. To ensure maximum reliability testing, it is preferable if the selection of first external pin 102 corresponds to an input pin that enables burn-in enable detector 110 while simultaneously activating low-voltage internal circuitry 106. If, for example, a chip select pin is used for first external pin 102, it is desirable that the active state of the chip select pin also activates the burn-in enable detector 110 such that the internal circuitry is fully activated during the burn-in test.

During normal operating mode, the output of burn-in enable detector 110 is inactive and does not substantially interfere with the operating characteristics of integrated circuit device 100. Because, however, there is a finite capacitance associated with burn-in enable detector 110, it is desirable to utilize an input signal that is not required to transition frequently. In the embodiment of the present invention in which integrated circuit device 100 comprises an integrated circuit memory such as a static RAM, the LBOB pin provides an attractive option for driving burn-in enable detector 110 because the signal, which is an industry standard signal on a variety of static RAM devices, is an essentially static or steady state input that is not required to transition frequently between logic states. The small, but finite, capacitance associated with burn-in enable detector 110 does not, therefore, present a significant issue in terms of device performance.

Figure 4:
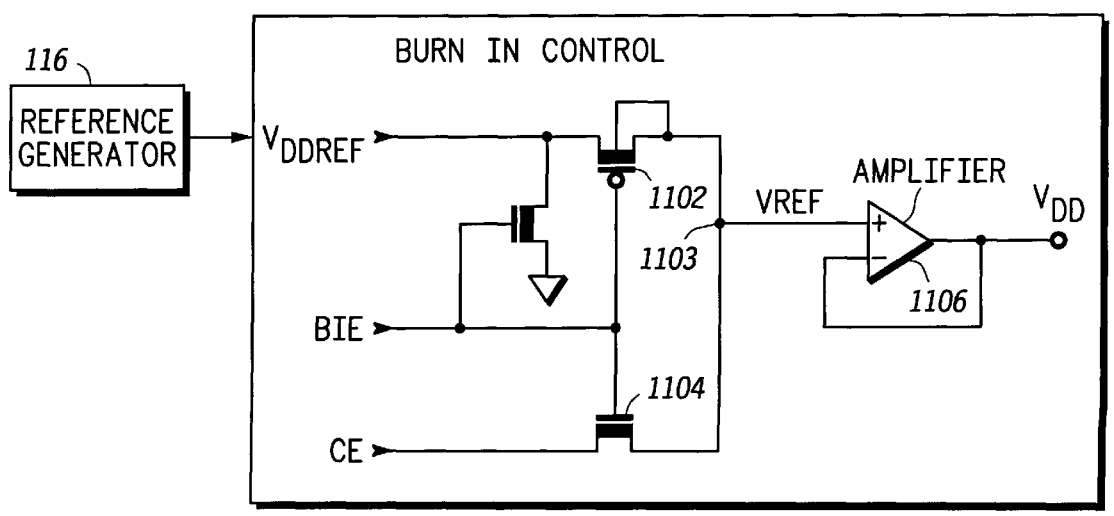
FIG. 4 shows a circuit diagram of the multiplexor and regulator circuits indicated in FIG. 1 according to one embodiment of the present invention.

In the preferred embodiment, burn-in enable detector 110 provides a burn-in enable signal 111 to the control or select input of multiplexor 114. In one embodiment, burn-in enable signal 111 is asserted when a voltage outside of the normal operating voltage is applied the first external pin 102. In this manner, burn-in enable detector 110 serves as a mode detector that provides a mode enable signal when an input signal is maintained at a voltage that is outside the normal operation range. The pair of inputs to supplied to multiplexer 114, coupled with voltage regulator 118, serve as a switchable voltage regulator that provides a regulated supply voltage to low voltage internal circuitry 106 in a normal operating mode and a higher voltage, such as a suitable burn-in voltage, to low voltage internal circuitry 106 when the mode enable signal is asserted. Turning momentarily to FIG. 4, a circuit diagram of one embodiment of the switchable voltage regulator 400 is shown. In this embodiment, the switchable voltage regulator 400 includes the multiplexor 114 and voltage regulator 118. Multiplexer 114 includes a first pass transistor 402 and a second pass transistor 404. First pass transistor 402 is connected between the output of reference voltage generator 116 and a node 403. Second pass transistor 404 is connected between the second external pin 112 and node 403. Node 403 is connected to the input of voltage regulator 118. The conductivity types of first and second pass transistors 402 and 404 are opposite. In the depicted embodiment, first pass transistor 402 is a p-channel device and second pass transistor 404 is an n-channel device. The gates of first and second pass transistor 402 and 404 are driven by output of the burn-in enable detector circuit 110 such that the voltage at first external pin 102 selects between the voltage generated by reference voltage generator 116 and the voltage supplied via second external pin 112 as the voltage source for voltage regulator 118. In the depicted embodiment, voltage regulator 118 comprises an operational amplifier 406 configured with negative feedback and a gain of unity.

Turning now to FIG. 2, one embodiment of a circuit suitable for use as burn-in enable circuit 110 is depicted. In this embodiment, burn-in enable 110 includes input protection circuitry 202 that is connected to first external pin 102 to the interconnect 204 that is connected to first external pin 102 to provide a low impedance current path if the voltage on interconnect 204 exceeds its typical operating voltage. Input protection circuitry 202 includes a pair of diodes D4 and D3 connected between the externally supplied $V_{dd}$ supply (labeled as $V_{ddx}$ in FIG. 2) and ground. Interconnect 204 is connected through a driver to internal operating circuitry. In addition, interconnect 204 connects first external pin 102 to burn-in enable circuit 110. Burn-in enable circuit 110 as depicted in FIG. 2 includes a pair of diodes or isolation devices 206a and 206b connected between interconnect 204 and node 208. The output terminals or current terminals of a p-channel transistor are connected between node 208 and node 212. The output terminals of an n-channel transistor 214 are connected between node 212 and ground. The gates of n-channel transistor 214 and p-channel transistor 210 are connected to a regulated $V_{dd}$ supply voltage that does not vary significantly with variations in the externally supplied $V_{dd}$). Node 212 drives a pair of CMOS inverters 216 and 218 that generate the burn-in enable signal that is routed to the select input of multiplexor 114. In normal operating mode, when the voltage on first external pin 102 is between ground and $V_{dd}$, node 212 is maintained at ground by n-channel transistor 214 thereby maintaining the burn-in enable signal at logical 0. When a second operating mode is desired, such as a burn-in mode, the externally supplied voltage $V_{ddx}$ is raised and the voltage at first external pin 102 is raised as well. As the voltage on interconnect 204 is raised and the gate voltage on p-channel transistor 210 is maintained at the nominal $V_{dd}$ value, the voltage at node 208 is coupled higher via diodes D1 and D2 and will eventually rise to a level that will turn p-channel transistor 210 on. When transistor 210 is on, the voltage at node 212 will rise to a value intermediate between ground and $V_{ddx}$. The transistors 210 and 214 are sized to ensure that the voltage at node 212 when both transistors are conducting is sufficient to flip inverters 216 and 218 thereby driving the burn-in enable signal to a high state that will select an alternate voltage source as the voltage source for lower power circuitry 106. In other words, when burn-in enable circuit 110 supplies burn-in enable signal, an externally supplied voltage is supplied to low power circuitry 106.

Figure 3:
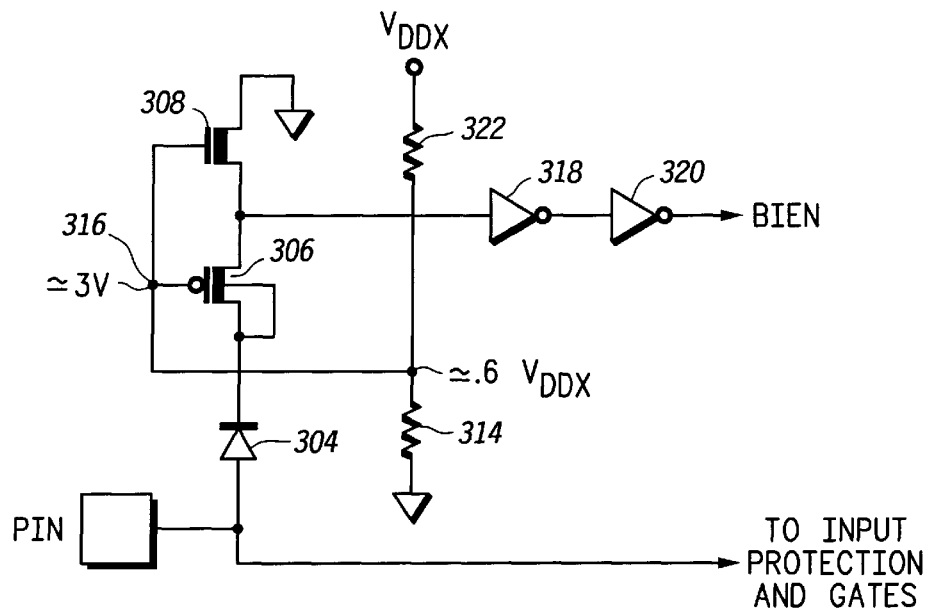
FIG. 3 shows an alternative embodiment of the burn-in enable circuit of FIG. 1 according to one embodiment of the present invention.
Figure 5:
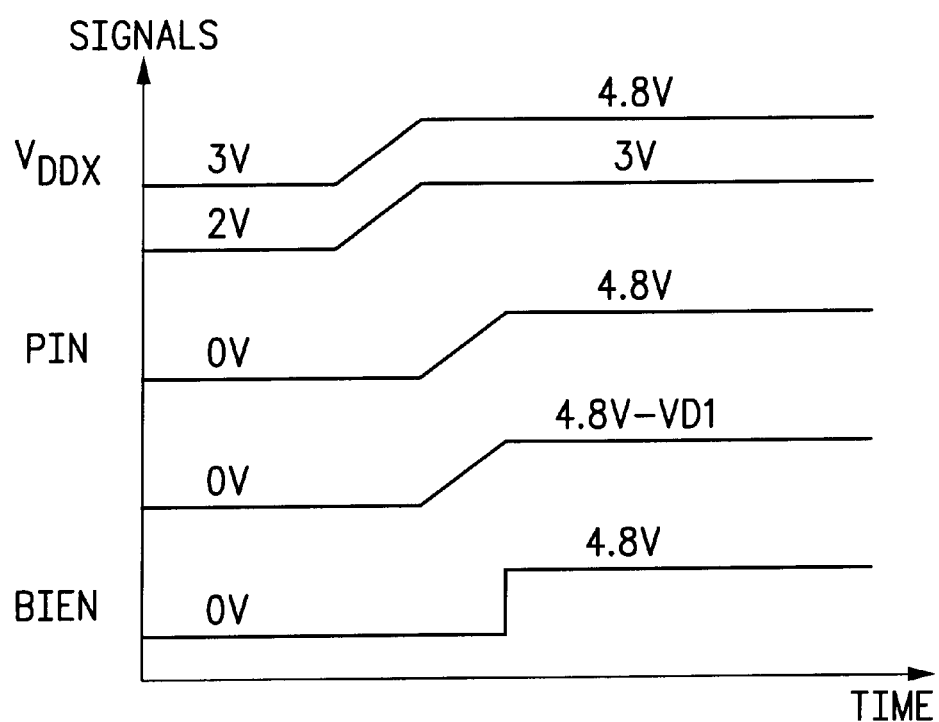
FIG. 5 is a simplified timing diagram illustrating operation of the burn-in enable circuit of FIG. 1.

Turning to FIG. 3, embodiment of burn-in enable circuit 110 is depicted. In this embodiment, burn-in enable circuit 110 includes a diode 304 that acts as an isolation device connected between first external pin 102 and node 305. Node 305 is connected to a first output terminal of p-channel transistor 306. The second output terminal of p-channel transistor 306 is connected to node 310 and to a first output terminal of n-channel transistor 308. The second output terminal of n-channel transistor 308 is grounded. The gates of p-channel transistor 306 and n-channel transistor 308 are driven by the voltage at node 316 of a voltage divider circuit 311. Voltage divider circuit 311 include a first resistor 312 and a second resistor 314 connected in series between the externally supplied $V_{ddx}$ and ground. The node 310 drives a pair of inverters 318 and 320 to supply the burn-in enable signal that is connect to the select input of multiplexor 114. The voltage divider circuit is designed to bias node 316 to a voltage at which p-channel transistor is close to, but not quite, conducting when a logical high is applied to first external pin 112 (i.e., the $V_{gs}$ of transistor 306 is slightly below the devices threshold voltage $V_t$ when first external pin 112 is high). In this state, n-channel device the voltage a node 316 is sufficient to turn on channel device 308 and drive node 310 to ground thereby driving burn-in enable signal to ground. When $V_{ddx}$ and first external pin 112 are driven with a voltage higher than the normal operating voltage, node 305 rises to a level sufficient to turn on p-channel transistor 306 causing node 310 to rise sufficiently to flip the inverters 318 and 320 to produce the asserted burn-in enable signal to multiplexor 114. FIG. 5 diagrams voltage vs. time for the signals of concern in the embodiment of burn-in enable circuit 110 depicted in FIG. 3. In this depiction, the normal operating range Of $V_{dd}$ is 3.3V±10% and the voltage used to signal the burn-in condition is 4.8V. FIG. depicts the rapid transition in the burn-in enable signal from 0V to 4.8V when first external pin 102 is transitioned from ground to $V_{ddx}$ after raising $V_{ddx}$ to 4.8V.

Thus it will be appreciated that the described circuit implement a method of operating a semiconductor device that includes low voltage circuitry 106 and a first external pin 102 that receives a first information signal within a predetermined range. The method includes applying a normal operating voltage to the low voltage internal circuitry 106 as a power supply to the low voltage circuitry and applying a mode enable voltage, that is outside the predetermined range voltage range, to first external pin 102. A higher voltage than the normal operating voltage is then applied to the low voltage internal circuitry 106 in response to applying the mode enable signal to the first external pin 102. It will be further appreciated that the circuit described implements a method in which a powering voltage is applied to the low voltage internal circuitry 106 via a reference input of regulator 118 during a normal mode of operation. During a burn-in mode, a chip enable input 112 is coupled to the reference input of the voltage regulator 118. The burn-in mode is initiated by applying a mode enable voltage, which is outside of the normal operating range to the first external pin 102.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. An integrated circuit memory which receives a power supply voltage on an external pin and has high voltage internal circuitry which receives the power supply voltage and low voltage internal circuitry, comprising:

a first external pin which receives a first information signal which provides operating information within a predetermined voltage range and provides burn-in enable information when at a different voltage outside the predetermined voltage range;

a burn-in enable detector, coupled to the first external pin, which provides a burn-in enable signal in response to the first information signal being at the different voltage;

a reference generator having an output;

a regulator having a reference input and an output coupled to the low voltage internal circuitry;

a multiplexer having a first input coupled to the output of the reference generator, a second input for receiving a burn-in voltage, and a control input for receiving the burn-in enable signal.

2. An integrated circuit memory which has low voltage internal circuitry and a first external pin which receives a first information signal which provides operating information within a predetermined voltage range, comprising:

a mode detector, coupled to the first external pin, which provides a mode enable signal in response to the first information signal being at a different voltage which is outside the predetermined voltage range; and a switchable regulator which provides a supply voltage to the low voltage internal circuitry to power the low voltage internal circuitry at a regulated voltage in a normal mode of the integrated circuit memory and at a higher voltage than the regulated voltage in response to the mode enable signal;

a reference generator coupled to the switchable regulator, and an external pin coupled to the switchable regulator.

3. The integrated circuit of claim 2, wherein the external pin is a chip enable pin.

4. An integrated circuit memory which is coupled to first and second power supply terminals and which has low voltage internal circuitry, a normal mode, a burn-in mode, and a first external pin, comprising:

a first isolation device having a first terminal coupled to the first external pin, and a second terminal;

a first transistor having a first current terminal coupled to the second terminal of the isolation device; a control terminal coupled to the first power supply terminal, and a second current terminal for providing an output;

a switchable regulator, responsive to the output of the first transistor, which provides a supply voltage to the low voltage internal circuitry to power the low voltage internal circuitry at a regulated voltage in a normal mode of the integrated circuit memory and at a higher voltage than the regulated voltage in the burn-in mode.

5. The integrated circuit of claim 4 further comprising a voltage divider interposed between the first power supply terminal and the control input of the first transistor.

* * * * *